United States Patent [19]

Kondo

[11] Patent Number: 4,549,147

[45] Date of Patent: Oct. 22, 1985

[54] LOAD IMPEDANCE DETECTOR FOR AUDIO POWER AMPLIFIERS

[75] Inventor: Hikaru Kondo, Zama, Japan

[73] Assignee: Victor Company of Japan, Limited, Yokohama, Japan

[21] Appl. No.: 480,927

[22] Filed: Mar. 31, 1983

[30] Foreign Application Priority Data

Apr. 1, 1982 [JP] Japan .............................. 57-47179[U]
Jun. 17, 1982 [JP] Japan .............................. 57-90459[U]
Sep. 20, 1982 [JP] Japan .............................. 57-142416[U]

[51] Int. Cl.[4] ............................................. H03F 3/26
[52] U.S. Cl. ................................. 330/297; 330/207 P; 330/267; 330/298
[58] Field of Search ............... 330/267, 268, 297, 298, 330/207 P, 255

[56] References Cited

U.S. PATENT DOCUMENTS 3,500,218 3/1970 Burwen .............................. 330/298

FOREIGN PATENT DOCUMENTS 2160396 8/1974 Fed. Rep. of Germany .
2830481 1/1979 Fed. Rep. of Germany .
3006628 8/1981 Fed. Rep. of Germany .
3018001 11/1981 Fed. Rep. of Germany .
1033747 6/1966 United Kingdom .
1373134 11/1974 United Kingdom .
2027307 2/1980 United Kingdom .

Primary Examiner—James B. Mullins
Assistant Examiner—Steven J. Mottola
Attorney, Agent, or Firm—Cushman, Darby & Cushman

[57] ABSTRACT

Disclosed is a load impedance detector for detecting a variation of the load impedance of a single-ended push-pull amplifier having a pair of first and second transistors, the emitters of which are interconnected by a pair of series-connected first and second resistors forming a first node to which the load impedance is connected. Third and fourth resistors are connected in series to the emitter of the first transistor to form a bridge circuit with the first resistor and the load impedance so that the third and fourth resistors define a second node therebetween. A voltage difference between the first and second nodes is detected by a differential circuit which is responsive to there being a simultaneous presence of a first state in which the detected voltage difference is higher than a first predetermined value and a second state in which the potential across the load impedance is higher than a second predetermined value for generating an output signal. This output signal is utilized for controlling the level of the voltage supplied to the amplifier to compensate for the impedance variation.

14 Claims, 4 Drawing Figures

LOAD IMPEDANCE DETECTOR FOR AUDIO POWER AMPLIFIERS

BACKGROUND OF THE INVENTION

The present invention relates to a load impedance detector for detecting a variation of the load impedance of a circuit, particularly, an audio power amplifier, and further relates to a power supply for the audio power amplifier employing the impedance detector for controlling the supply voltage in response to a variation in the impedance of one or more loudspeakers.

In an audio power amplifier which drives one or more speakers arranged to be switched on or off during record playback, it is desirable that the power supplied to such speakers be maintained constant despite a varying load impedance. If a single speaker is employed, a replacement of the speaker with one having a different impedance value would require that the output power to the speaker be manually switched so that the impedance difference is compensated. In applications where plural speakers are connected to the power amplifier through a switched network, an automatic power control circuit would require a relay for switching the output power level if the switched condition imposes a different load impedance.

One approach would be to employ a bridge-circuited detector having the load impedance connected in one arm of the bridge. However, the reactive component of the load impedance causes an ambiguity in the detector so that it tends to falsely distinguish the desired impedance value.

SUMMARY OF THE INVENTION

It is therefore an object of the present invention to provide a reliable load impedance detector and provide a power supply for an audio power amplifier utilizing the load impedance detector to keep the amount of power supplied to a loudspeaker constant.

According to a first aspect of the invention, the load impedance detector is adapted for use in an audio power amplifier of a single-ended push-pull circuit having a pair of first and second transistors of opposite conductivity types, the emitters of these transistors being interconnected by a pair of series-connected first and second resistors. The load impedance is connected from a first node between the first and second resistors to ground. The detector comprises a third and fourth resistors connected in series from the emitter of the first transistor to ground to define a second node therebetween. Differential means is coupled to the first and second nodes for detecting a voltage difference therebetween and for generating therefrom, an output signal in response to the simultaneous presence of a first state in which the detected voltage difference is higher than a first predetermined value and a second state in which the potential across the load impedance is higher than a second predetermined value. The output signal is utilized for controlling the level of the voltage supplied to the power amplifier to compensate for the impedance variation.

According to a second aspect of the invention, there is provided a power supply for a single-ended push-pull amplifier having a pair of first and second transistors of opposite conductivity types, the transistors having emitters interconnected by a pair of series-connected first and second resistors, and a loudspeaker having an impedance connected to a first node between the first and second resistors. The power supply comprises a transformer having a primary winding connectable in use to a voltage source and a secondary winding having a first tap for generating a high voltage and a second tap for generating a low voltage, a smoothing capacitor for supplying a smoothed voltage to the collectors of the first and second transistors, first gate-triggered, unidirectionally conducting means connected from the first tap to the smoothing capacitor, and second unidirectionally conducting means connected from the second tap to the smoothing capacitor. A disabling circuit is provided for disabling the first unidirectionally conducting means when the impedance is different from a preset value. The disabling circuit comprises third and fourth resistors connected in series between the emitter of the first transistor to ground to define a second node therebetween, and differential means coupled to the first and second nodes to form a bridge circuit with the first, third and fourth resistors and the impedance for detecting a voltage difference between the first and second nodes and generating therefrom a disabling signal in response to there being a simultaneous presence of a first state in which the detected voltage difference is higher than a first predetermined value and a second state in which a potential across the impedance is higher than a second predetermined value for disabling the first unidirectionally conducting means.

According to a first preferred embodiment, the differential means comprises a differential amplifier having first and second inputs coupled to the first and second nodes, respectively, and means for causing the differential amplifier to become operative when the potential across the load impedance exceeds the second predetermined value.

According to a second preferred embodiment, the differential means comprises a differential amplifier having first and second inputs coupled to the first and second nodes, respectively, to generate a first signal corresponding to the voltage difference between the first and second nodes, a comparator for comparing the potential across the load impedance with the second predetermined value to generate a second signal and a coincidence gate for detecting when the first signal coincides with the second signal to generate the output signal.

BRIEF DESCRIPTION OF THE DRAWINGS

The present invention will be described in further detail with reference to the accompanying drawings, in which.

DETAILED DESCRIPTION

Figure 1:
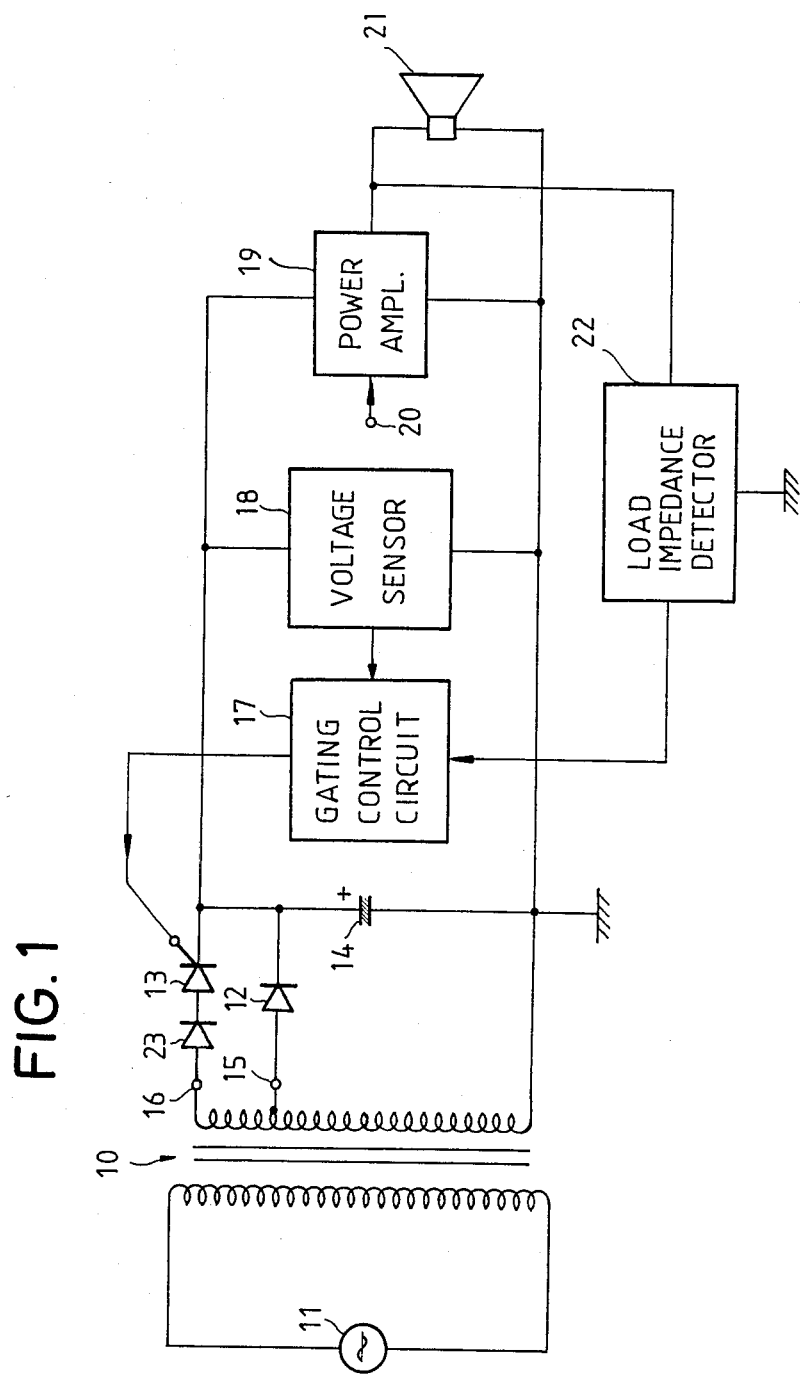
FIG. 1 is a block diagram of a power supply circuit for an audio power amplifier embodying the invention.

Referring to FIG. 1, there is schematically a power section of an audio circuit. The primary winding of a step-down transformer 10 is connected to an AC power source 11 and its secondary winding provides a reduced AC voltage which is rectified and smoothed by a circuit comprising a diode 12 and a thyristor 13 and a capacitor 14. The diode 12 has its anode coupled to an intermediate tap 15 of the secondary winding and its cathode coupled to one end of the capacitor 14, the other end of which is connected to ground. The thyristor 12 has its anode connected to an end tap 16 of the secondary winding and its cathode likewise connected to the capacitor 14. The gate electrode of thyristor 13 is connected to the output of a known gating circuit 17 and is repeatedly triggered into conduction in response to a gating pulse applied thereto to couple a higher AC voltage to the capacitor 14. When the gating circuit is disabled, the thyristor 13 remains nonconductive and the diode 12 couples a lower AC voltage to the capacitor 14. A voltage sensor 18 is connected across the capacitor 14 to generate a control signal proportional to the DC voltage supplied to a load or amplifier 19. This amplifier comprises a pair of transistors of opposite conductivity types connected in a complementary single-ended push-pull (SEPP) circuit configuration.

This control voltage is applied to the gating circuit 17 to control the phase of the gating pulse so that the DC voltage is maintained constant. The amplifier 19 is a power stage of an audio circuit which intensifies an input signal at terminal 20 to a level sufficient to drive a loudspeaker 21. The impedance of the loudspeaker, i.e., the load impedance of the amplifier 19, is monitored by a load impedance detector 22. When the impedance of the loadspeaker 21 is 8 ohms, the detector 22 provides no output and if the 8-ohm speaker is replaced with a 4-ohm speaker, the detector 22 provides a disabling signal to the gating circuit 17 to reduce the AC voltage to a level which is typically 30% lower than the previous voltage so that the 4-ohm speaker may be driven by the same amount of power as the 8-ohm loudspeaker. For purposes of preventing a reverse surge current which would otherwise be generated in response to the turn-off of thyristor 13, a diode 23 is preferably connected in series with the thyristor.

Figure 2:
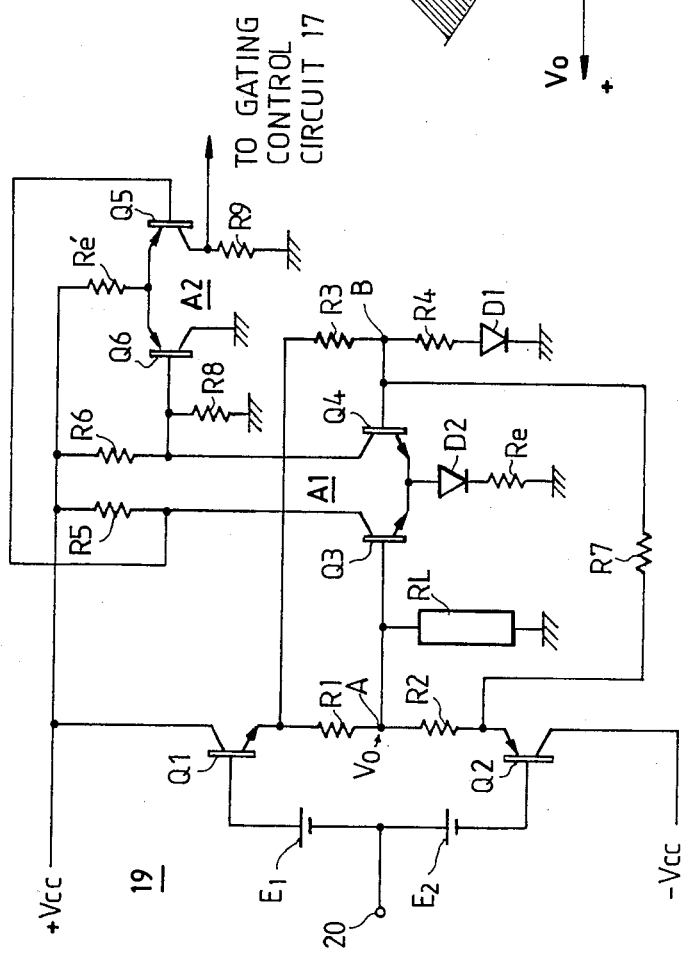
FIG. 2 is a circuit diagram of the load impedance detector of FIG. 1.

In FIG. 2, details of the audio power amplifier 19 and the load impedance detector 22 are illustrated. The amplifier 19 is of a complementary single-ended push-pull type comprising an NPN transistor Q1 and a PNP transistor Q2 connected in series between voltage terminals at $+Vcc$ and $-Vcc$ with a series combination of resistors R1 and R2 being interposed between the emitters of transistors Q1 and Q2. The resistors R1 and R2 define a node A at which an audio output Vo is available. The loudspeaker 21 is represented by a load impedance RL which is connected to the node A and ground. The transistors Q1 and Q2 are oppositely biased with respect to each being by DC voltage sources E1 and E2. The input terminal 20 is connected to the junction between the voltage sources E1 and E2.

According to a first embodiment of the invention, the load impedance detector 22 essentially comprises a first differential amplifier A1 and a second differential amplifier A2 connected to the output of first differential amplifier A1. The first differential amplifier A1 comprises a pair of NPN transistors Q3 and Q4 having their emitters coupled together to ground by a series circuit including a diode D2 and a resistor Re. This diode is rendered conductive when the voltage Vo is positive. The collectors of transistors Q3 and Q4 are connected by resistors R5 and R6, respectively, to the voltage terminal $+Vcc$.

The base of transistor Q3 is connected to the node A, while the base of transistor Q4 is connected to a node B between resistors R3 and R4 with the resistor R3 being connected to the emitter of transistor Q1 and the resistor R4 being connected to ground by a diode D1. The base of transistor Q4 is further connected by a resistor R7 to the emitter of transistor Q2.

The second differential amplifier A2 comprises a pair of PNP transistors Q5 and Q6 having their emitters connected in common to the voltage terminal $+Vcc$ through a resistor Re'. The collector of transistor Q6 is grounded, while the collector of transistor Q5 is connected by a resistor R9 to ground to develop a disabling signal which is applied to the gating control circuit 17. The base of transistor Q6 is connected to the collector of transistor Q4 and also to ground by a resistor R8, while the base of transistor Q5 is connected to the collector of transistor Q3.

The resistors R1, R3 and R4 are selected in relation to the load impedance RL, which is normally 8 ohms, so that $R1 \times R4 = R3 \times RL$ is attained to form a bridge circuit. The resistance value of resistor R7 is equal to or slightly smaller than that of resistor R3, and resistors R1 and R2 have substantially equal resistances. The DC bias voltages E1 and E2 are selected such that the transistors Q1 and Q2 operate in a B-dominant AB class mode. If there is no input audio signal at the terminal 20, there is an idle current of about 10 milliamperes. This causes a voltage of about several tens of millivolts to develop across each of the resistors R1 and R2. If the resistor R7 is not provided, the potential at node A would be several tens of millivolts higher than the potential at node B and transistor Q4 would be biased into conduction and transistor Q3 biased off. As a result there is no sufficient margin in transistor Q4 to accommodate increments in the collector current. The effect of the resistor R7 is to equalize the potentials at nodes A and B so that transistors Q3 and Q4 provide equal idle currents.

Figure 3:
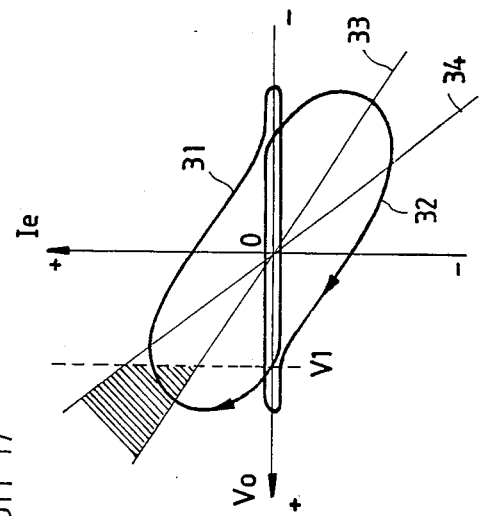
FIG. 3 is a graphic illustration of the operating characteristic of the load detector.

FIG. 3 is a load diagram of transistors Q1 and Q2 in which the emitter current Ie of transistor Q1 is plotted as a function of the potential at node A. Shown at 31 and 32 are the load lines of transistors Q1 and Q2, respectively, when operating at a frequency at which there is a voltage-current phase difference of 45 degrees with the load impedance RL having an absolute value of 8 ohms. Illustrated at 33 and 34 are load lines when the load impedance is of pure resistance values of 8 and 4 ohms, respectively, on which transistor Q1 operates in the first and second quadrants and transistor Q2 operates in the third and fourth quadrants.

The resistors Re, R5 and R6 are selected so that the first differential amplifier A1 may operate when the absolute value of voltage Vo at node A is higher than a threshold voltage V1 in the load diagram.

The operation of the circuit of FIG. 2 is as follows. With the potential Vo at node A being negative, the diode D2 is reverse-biased and no current flows through resistor Re, whereby transistors Q3 and Q4 are turned off (i.e., the circuit is operating on the first quadrant of load line 31). Therefore, the differential amplifier A1 is inoperative. If the potential Vo is positive, the diode D2 is forward-biased to cause a current to flow in resistor Re. When the potential Vo exceeds V1, the differential amplifier A1 becomes operative to function as a load impedance detector. With the first differential amplifier A1 being operative. The second differential amplifier A2 now becomes operative when the voltages developed across resistors R5 and R6 increase to a level sufficient to drive the transistors Q5 and Q6 into conduction.

With a positive potential Vo and the load impedance having a pedetermined value, the resistor R7 can be considered to be coupled in parallel across the nodes A and B and an equilibrium condition is established in the bridge circuit by resistors R1, R3, R4 and load impedance RL. The transistor Q6 is biased by a voltage drop across resistor R8 so that there is no collector current in the transistor Q5 and hence no voltage develops in the resistor R9 and the gating control circuit 17 remains enabled. If the load impedance reduces below the predetermined value, the potential at node B becomes higher than the potential at node A, producing a collector current in the transistor Q6 to generate a voltage across resistor R9 which is applied as a disabling signal to the gating circuit 17.

Since the first differential amplifier A1 has a threshold V1, this amplifier is thought of as operating within the cross-hatched area of FIG. 3. It is seen therefore that even if the load impedance has a reactance component and its absolute value is still 8 ohms, the load impedance detector 22 no longer operates falsely by detecting such impedances as warranting the disablement of the gating circuit 17.

Figure 4:
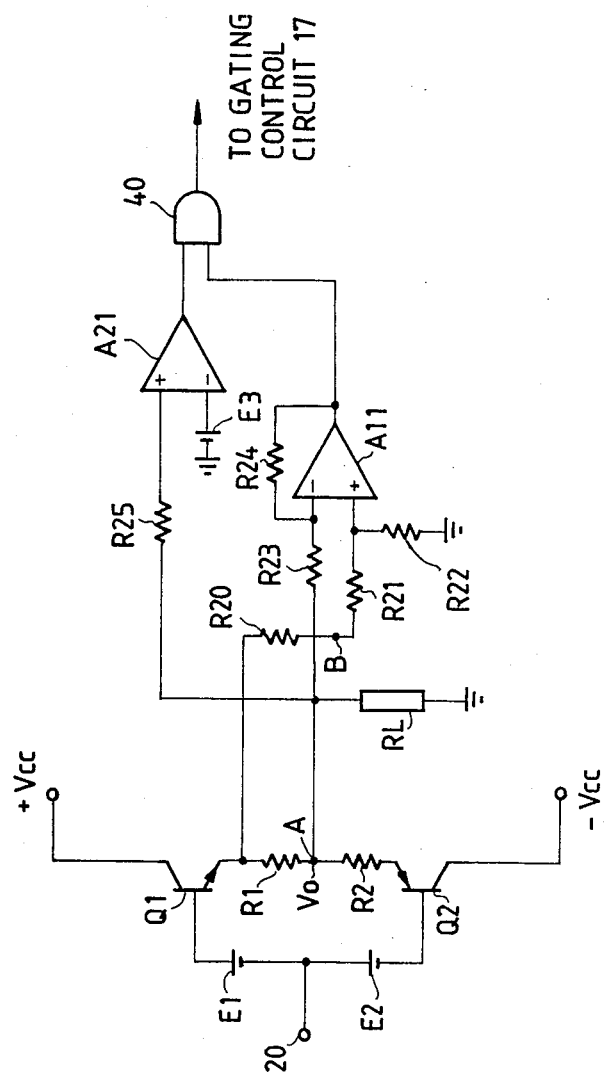
FIG. 4 is a circuit diagram of an alternative embodiment of the invention.

FIG. 4 is an illustration of an alternative embodiment of the load impedance detector in which parts corresponding to those in FIG. 2 are marked with numerals corresponding to those in FIG. 2. The emitter of transistor Q1 is coupled by a series circuit including a resistor R20 and a resistor R21 to the noninverting input of a differential amplifier A11 and the node A is connected by a resistor R23 to the inverting input of the amplifier A11. A resistor R24 provides a feedback circuit between the output of amplifier A11 and its inverting input, and a resistor R22 connects the noninverting input to ground. The node A is further connected by a resistor R25 to the noninverting input of a voltage comparator A21 having its inverting input being biased by a reference voltage V1 supplied from a DC source E3. The outputs of the differential amplifier A11 and comparator A21 are coupled to an AND gate 40 to generate a load detector output.

The resistors R21 to R24 have the following relation:
R21 = R23
R22 = R24

Resistors R21 and R22 function as a voltage divider for reducing the voltage at the emitter of transistor Q1 to a level appropriate for the differential amplifier A11. Likewise, resistors R23 and 24 act as a voltage divider for the voltage at the node A to a level appropriate for the amplifier A11. For calculation purposes, the node B is taken to be located at a junction between resistors R20 and R21, and the resistors R21 and R22 can be considered as one of the arms of the bridge circuit whose equilibrium condition is satisfied by the following relation:

$$R1 \times (R21 + R22) = R20 \times RL$$

The circuit of FIG. 4 is quantitavely analyzed as follows. The gain Ga of amplifier A11 with respect to the voltage at node A is given by $$Ga = -R24/R23 \quad (1)$$

Likewise, the gain Gb of amplifier A11 with respect to the voltage at node B is given by $$Gb = \frac{R23 + R24}{R23} \times \frac{R22}{R21 + R22} \quad (2)$$

$$= R24/R23$$

The voltage output of the amplifier A11 when it turns on is given as follows:

$$Vab \times (R24/R23) \quad (3)$$

where Vab is a voltage difference between nodes A and B.

If the 8-ohm loudspeaker is replaced with a 4-ohm impedance speaker, the equilibrium condition is lost and a voltage develops between nodes A and B which in turn causes amplifier A11 to generate the voltage defined by Equation 3. At the same time, the voltage at the noninverting input of the comparator A21 rises above the threshold V1 to turn it on, and a disabling signal results at the output of AND gate 40.

What is claimed is:

1. A load impedance detector for detecting a variation of the impedance of a load in a single-ended push-pull amplifier having a pair of first and second transistors of opposite conductivity types, said transistors having emitters interconnected by a pair of series-connected first and second resistors, said load being connected to a first node between said first and second resistors, comprising:
   third and fourth resistors connected in series to the emitter of said first transistor, said third and fourth resistors defining a second node therebetween; and
   differential means coupled to said first and second nodes to form a bridge circuit when said first, third and fourth resistors and said load, the differential means being operative only when the potential across said load exceeds a predetermined threshold for detecting a voltage difference between said first and second nodes and generating therefrom an output signal in response to said detected voltage difference being higher than a predetermined value.

2. A load impedance detector is claimed in claim 1 wherein said differential means comprises a differential amplifier having first and second inputs coupled to said first and second nodes respectively, and means for causing said differential amplifier to become operative when the potential across said load exceeds said threshold.

3. A load impedance detector as claimed in claim 1, wherein said differential means comprises:
   a pair of third and fourth transistors of like conductivity types having emitters coupled together by an emitter circuit to ground and base electrodes respectively coupled to said first and second nodes, said third and fourth transistors having collectors connected by fifth and sixth resistors to a voltage source; and
   a seventh resistor by which said second node is connected to the emitter of said second transistor.

4. A load impedance circuit as claimed in claim 3, wherein said emitter circuit includes a diode and a resistor.

5. A load impedance detector as claimed in claim 3, wherein said differential means further comprises:
   a pair of fifth and sixth transistors of like conductivity types but opposite to the conductivity types of said third and fourth transistors, said fifth and sixth transistors having emitters connected by a common resistor to said voltage source and base electrodes coupled, respectively, to said fifth and sixth resistors, and having grounded collector circuits;

an eighth resistor for biasing the base of said sixth transistor; and a ninth resistor connected in the collector circuit of said fifth transistor to generate said output signal thereacross.

6. A load impedance detector as claimed in claim 1, wherein said differential means comprises a differential amplifier having first and second inputs coupled to said first and second nodes, respectively, to generate a first signal corresponding to the voltage difference between said first and second nodes, a comparator for comparing the potential across said load with said threshold to generate a second signal, and a coincidence gate for detecting when said first signal coincides with said second signal to generate said output signal.

7. A power supply for a single-ended push-pull amplifier having a pair of first and second transistors of opposite conductivity types, said transistors having emitters interconnected by a pair of series-connected first and second resistors, and a loudspeaker having an impedance connected to a first node between said first and second resistors, comprising:

a transformer having a primary winding connectable in use to a voltage source and a secondary winding having a first tap for generating a high voltage and a second tap for generating a low voltage;

a smoothing capacitor for supplying a gradually varying voltage to the collectors of said first and second transistors;

first, gate-triggered unidirectionally conducting means connected from said first tap to said smoothing capacitor;

second, unidirectionally conducting means connected from said second tap to said smoothing capacitor; and an impedance detector for generating a disabling signal when said impedance is different from a preset value, the load impedance detector comprising:

third and fourth resistors connected in series between the emitter of said first transistor and ground to define a second node therebetween;

differential means coupled to said first and second nodes to form a bridge circuit with said first, third and fourth resistors and said impedance so that the differential means becomes operative when said impedance develops a potential higher than a predetermined threshold, the differential means detecting a voltage difference between said first and second nodes and generating therefrom an output signal as said disabling signal in response to said detected voltage difference being higher than a predetermined value; and means for normally applying an enabling signal to the gate of said first unidirectionally conducting means and inhibiting said enabling signal in response to said disabling signal.

8. A power supply as claimed in claim 7 wherein said means for normally applying an enabling signal comprises means for triggering said first unidirectionally conducting means at intervals.

9. A power supply as claimed in claim 8, further comprising a voltage sensor for controlling the triggering intervals of said triggering means as a function of said gradually varying voltage.

10. A power supply as claimed in claim 7, wherein said differential means comprises a differential amplifier having first and second inputs coupled to said first and second nodes, respectively, and means for causing said differential amplifier to become operative when the potential across said impedance exceeds said threshold.

11. A power supply as claimed in claim 7, wherein said differential means comprises:

a pair of third and fourth transistors of like conductivity types having emitters coupled together by an emitter circuit to ground and base electrodes respectively coupled to said first and second nodes, said third and fourth transistors having collectors connected by fifth and sixth resistors to a voltage source; and a seventh resistor by which said second node is connected to the emitter of said second transistor.

12. A power supply as claimed in claim 11, wherein said emitter circuit includes a diode and a resistor.

13. A power supply as claimed in claim 9, wherein said differential means further comprises:

a pair of fifth and sixth transistors of like conductivity types but opposite to the conductivity types of said third and fourth transistors, said fifth and sixth transistors having emitters connected by a common resistor to said voltage source and base electrodes coupled respectively to said fifth and sixth resistors, and having grounded collector circuits;

an eighth resistor for biasing the base of said sixth transistor; and a ninth resistor connected in the collector circuit of said fifth transistor to generate said disabling signal thereacross.

14. A power supply as claimed in claim 7, wherein said differential means comprises a differential amplifier having first and second inputs coupled to said first and second nodes respectively to generate a first signal corresponding to the voltage difference between said first and second nodes, a comparator for comparing the potential across said impedance with said second predetermined value to generate a second signal and a coincidence gate for detecting when said first signal coincides with said second signal to generate said disabling signal.

* * * * *